(12) United States Patent
McCandless et al.

(10) Patent No.: US 6,537,845 B1
(45) Date of Patent: Mar. 25, 2003

(54) CHEMICAL SURFACE DEPOSITION OF ULTRA-THIN SEMICONDUCTORS

(76) Inventors: Brian E. McCandless, 243 W. Main St., Elkton, MD (US) 21921; William N. Shafarman, 1905 N. Van Buren St., Wilmington, DE (US) 19802

( * ) Notice: Subject to any disclaimer, the term of this patent is extended or adjusted under 35 U.S.C. 154(b) by 0 days.

(21) Appl. No.: 09/942,536

(22) Filed: Aug. 30, 2001

(51) Int. Cl.$^7$ ............................................... H01L 21/00
(52) U.S. Cl. ..................... 438/93; 438/492; 136/260; 136/264
(58) Field of Search ............................ 136/258, 260, 136/264; 438/22, 46, 47, 96, 97, 479, 488, 492, 93, 95

(56) References Cited

U.S. PATENT DOCUMENTS 4,095,006 A * 6/1978 Jordan .................. 136/258
5,112,410 A * 5/1992 Chen .................... 136/260

OTHER PUBLICATIONS

Nair, "Opto–electronic Characteristics of Chemically Deposited cadmium Sulphide Thin Films", Semicond Sci. Technol., vol. 3, p 134–135, 1988.*

"Solution–grown cadmium sulfide films for photovoltaic devices," T. L. Chu, Shirley S. Chu, N. Schultz, C. Wang, and C. Q. Wu, Journal of Electrochemical Society, vol. 139, No. 9, Sep. 1992.

* cited by examiner

Primary Examiner—Kamand Cuneo
Assistant Examiner—Asok Kumar Sarkar
(74) Attorney, Agent, or Firm—Roberts & Mercanti, LLP

(57) ABSTRACT

A chemical surface deposition process for forming an ultra-thin semiconducting film of Group IIB–VIA compounds onto a substrate. This process eliminates particulates formed by homogeneous reactions in bath, dramatically increases the utilization of Group IIB species, and results in the formation of a dense, adherent film for thin film solar cells. The process involves applying a pre-mixed liquid coating composition containing Group IIB and Group VIA ionic species onto a preheated substrate. Heat from the substrate causes a heterogeneous reaction between the Group IIB and VIA ionic species of the liquid coating composition, thus forming a solid reaction product film on the substrate surface.

32 Claims, 3 Drawing Sheets

CHEMICAL SURFACE DEPOSITION OF ULTRA-THIN SEMICONDUCTORS

GOVERNMENT INTEREST

The U.S Government has rights in this invention pursuant to Contract No. ZAK-8-17619-33 between the Department of Energy and the University of Delaware.

BACKGROUND OF THE INVENTION

1. Field of the Invention

The present invention relates to solar cells and other semiconductor devices. More particularly, the invention relates to a process for forming ultra-thin semiconductor films for solar cells.

2. Description of the Related Art

Photovoltaic devices, or solar cells, use the specific conductivity properties of semiconductors to convert visible and near visible light energy from the sun into usable electrical energy. In the past, solar cells for use in solar power generation have been formed of single crystal or polycrystalline silicon. However, such solar cells are expensive and difficult to mass-produce, as they require much time and energy for crystal growth and also complex subsequent steps.

Thus, thin film semiconductor solar cells have been developed. Thin film solar cells are typically prepared by forming a thin film layer of a semiconductor compound on a substrate such as a glass or stainless steel sheet, through relatively simple manufacturing steps. Thin film solar cells formed using Group II–VI or Group I–III–VI$_2$ compound semiconductors are particularly desirable, since they can be produced at low cost and with a good mass-production capability, and because films such as CdS and CdTe can be formed uniformly on substantially the entire surface of a glass substrate using a relatively easy process.

However, such thin film solar cells and their manufacturing processes are still in need of further improvement. This is because thin film solar cells are known to have a lower conversion efficiency than silicon crystal photovoltaic devices, and greater manufacturing costs. One preferred process known in the art for the formation of Group II–VI compounds is chemical bath deposition, which has various drawbacks. This process for forming such compounds often exhibits low utilization of the Group II species, leading to the generation of large amounts of hazardous waste by-products, thus increasing processing costs. There is also a problem with particulate formation caused by reaction in the bath, known as homogeneous nucleation, of product species prior to application to the substrate. This leads to imperfections in the resulting film.

Thus, it would be desirable to provide an improved process for forming low cost, high quality thin film solar cells having high conversion efficiencies. It would be further desirable to provide a process which exhibits an increased utilization of Group II species, resulting in the formation of less hazardous waste and thus lowering processing costs. It would also be desirable to limit the formation of particulates formed by homogeneous nucleation of product species, to thereby form uniform, dense films.

The present invention provides a solution to these problems and includes a chemical surface deposition process. The process of the present invention involves the preparation of a liquid coating composition which comprises at least one Group IIB ionic species, at least one Group VIA ionic species, and a complexing agent capable of causing the Group IIB ionic species and the Group VIA ionic species to combine. The liquid coating composition is applied onto a heated substrate surface, which substrate surface is at a temperature higher than the temperature of the liquid coating composition. Prior to application, the solution temperature is maintained at a low enough temperature to reduce or eliminate homogeneous nucleation in the bath. To obtain the desired heterogeneous nucleation on the substrate while minimizing such homogeneous nucleation in the bath, the solution temperature is kept at a lower temperature than the substrate. Application onto the heated substrate causes the Group IIB ionic species and the Group VIA ionic species to react on the substrate surface and form a solid reaction product film of the Group IIB ionic species and the Group VIA ionic species on the substrate. This process solves the problems discussed above by decreasing the formation of particulates formed by homogeneous reactions in bath, dramatically increasing the utilization of Group IIB species (from about 1% to almost 100%), and forming dense, adherent films for thin film solar cells.

SUMMARY OF THE INVENTION

The invention provides a chemical surface deposition process for forming a film on a substrate which comprises:
a) forming a liquid coating composition which comprises at least one Group IIB ionic species, at least one Group VIA ionic species, and a complexing agent capable of causing the Group IIB ionic species and the Group VIA ionic species to combine;
b) applying the liquid coating composition onto a heated substrate surface, which substrate surface is at a temperature higher than the temperature of the liquid coating composition; and
c) causing the Group IIB ionic species and the Group VIA ionic species to react on the heated substrate surface under conditions sufficient to form a solid reaction product film comprising a reduced form of the Group IIB ionic species and the Group VIA ionic species on the substrate surface.

The invention also provides a process for forming a solar cell which comprises:
a) forming a liquid coating composition which comprises at least one Group IIB ionic species, at least one Group VIA ionic species, and a complexing agent capable of causing the Group IIB ionic species and the Group VIA ionic species to combine;
b) applying the liquid coating composition onto a heated substrate surface, which substrate surface is at a temperature higher than the temperature of the liquid coating composition;
c) causing the Group IIB ionic species and the Group VIA ionic species to react on the heated substrate surface under conditions sufficient to form a solid reaction product film comprising a reduced form of the Group IIB ionic species and the Group VIA ionic species on the substrate surface;
d) removing any excess liquid coating composition from the substrate;
e) rinsing the film with water; and
f) drying the film.

DETAILED DESCRIPTION OF THE PREFERRED EMBODIMENT

Figure 1:
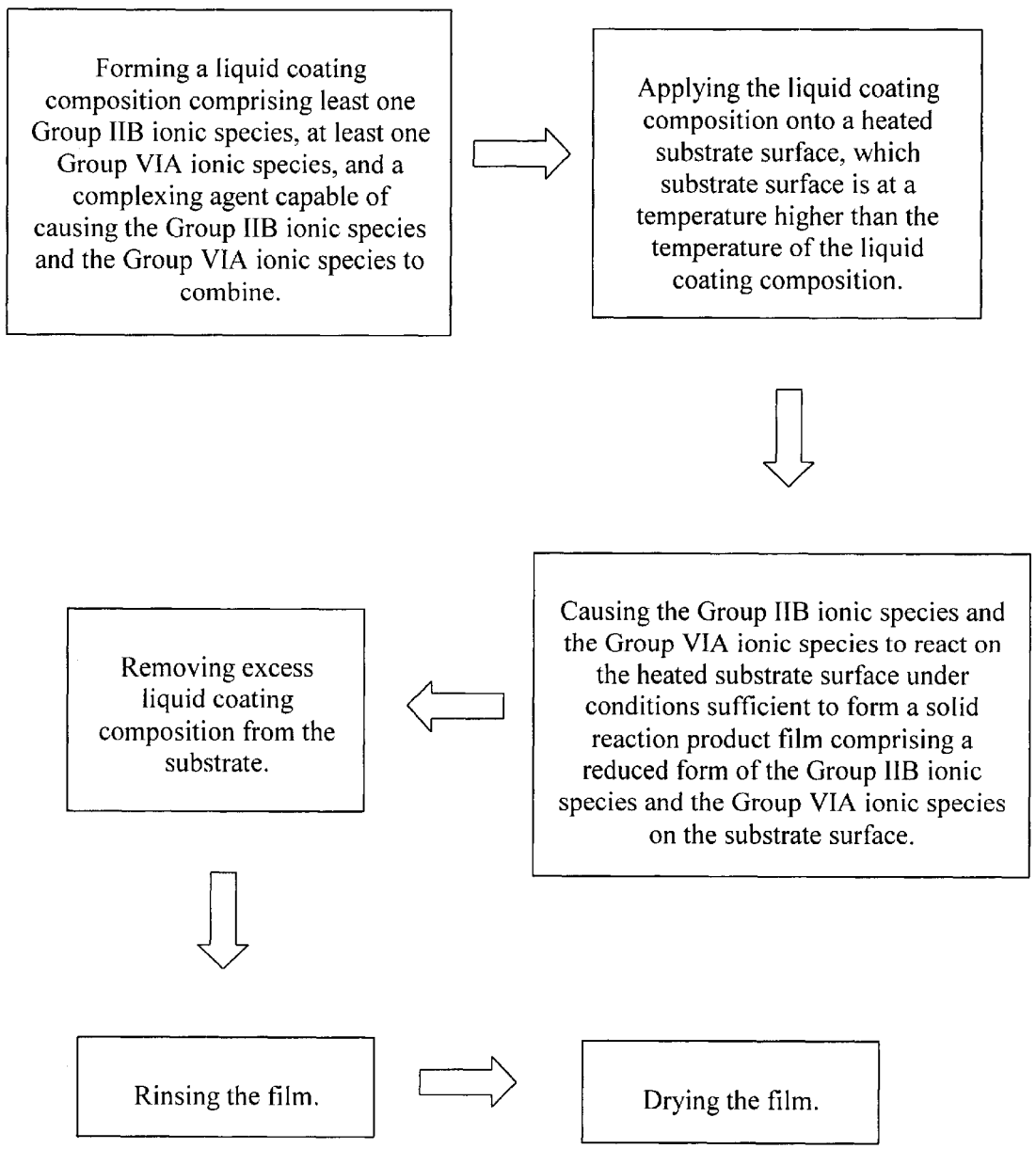
FIG. 1 shows a flow chart of the process of the present invention.
Figure 2:
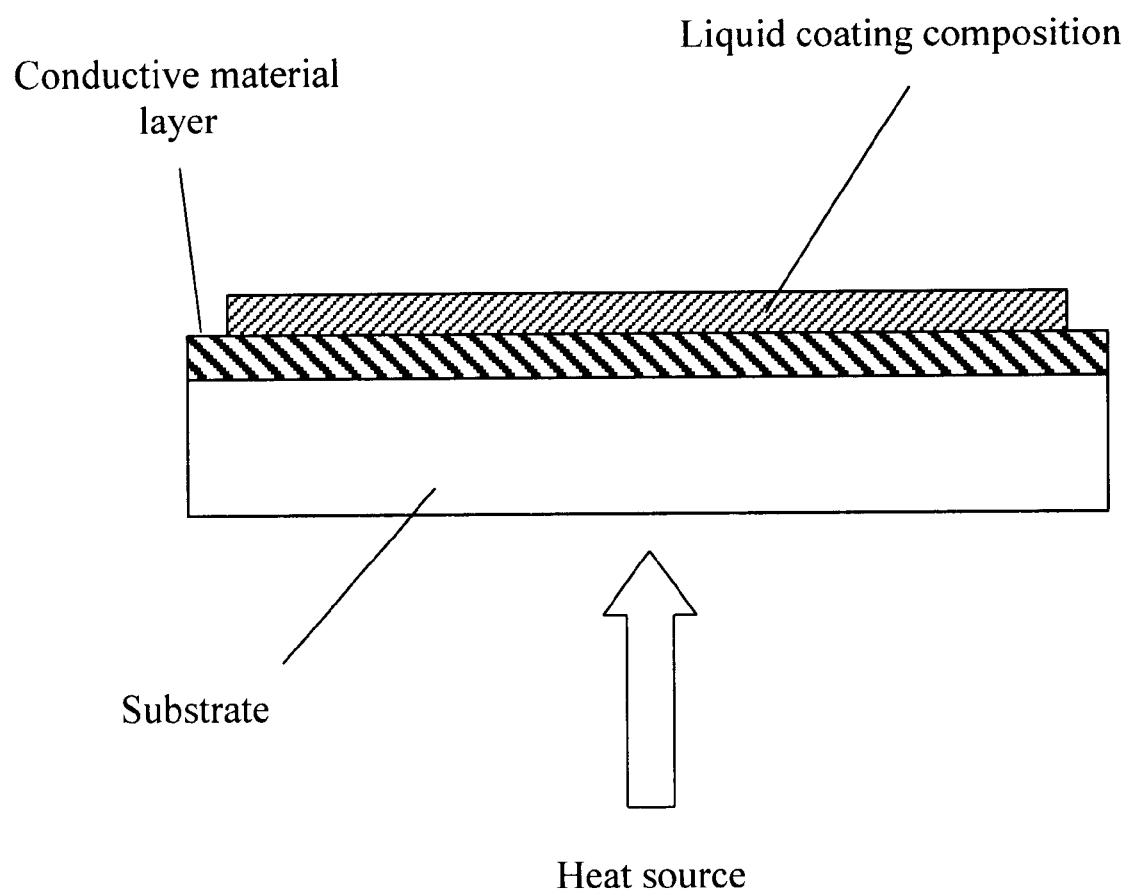
FIG. 2 shows a schematic side-view of the present invention being carried out on a surface.

The first step of the inventive process involves forming a liquid coating composition as indicated in FIGS. 1 and 2. According to the invention, the liquid coating composition comprises at least one Group IIB ionic species, at least one Group VIA ionic species, and a complexing agent.

The Group IIB ionic species comprises cadmium, mercury, zinc, or combinations thereof. Group IIB ionic species is preferably obtained from an aqueous solution of cadmium, mercury or zinc sulfate, acetate, bromide, fluoride, chloride, iodide, hydroxide, nitrate, oxalate, citrate, phosphate, tungstate, hydrates or combinations thereof. Preferably, the Group IIB ionic species component is present in the overall liquid coating composition at a concentration of from about 0.1 millimol to about 10 millimol per liter of the overall composition, more preferably from about 0.5 millimol to about 5 millimol per liter of the overall composition, and most preferably from about 1 millimol to about 2 millimol per liter of the overall composition.

The Group VIA ionic species comprises oxygen, sulfur, selenium, tellurium, polonium, or combinations thereof. The Group VIA ionic species is preferably obtained from an aqueous solution of oxides, halides, sulfates, nitrates, or ureates of the Group VIA species. Preferably, the Group VIA ionic species component is present in the overall liquid coating composition at a concentration of from about 0.05 mol to about 5 mol per liter of the overall composition, more preferably from about 0.1 mol to about 3 mol per liter of the overall composition, and most preferably from about 0.5 to about 1 mol per liter of the overall composition.

The complexing agent serves to control complexing of the Group IIB species, and affects the pH of the liquid coating composition. The complexing agent is capable of causing the Group IIB ionic species and the Group VIA ionic species to combine, most preferably upon the application of sufficient heat to cause such combining. Suitable complexing agents nonexclusively include diethanolamine (DEA) and ethylene diamine tetra-acetic acid (EDTA), and nitrogen-hydride compounds such as ammonium hydroxide and hydrazine. In a preferred embodiment of this invention, the complexing agent comprises ammonium hydroxide. The complexing agent is preferably present in the overall liquid coating composition at a concentration of from about 0.1 mol to about 5 mol per liter of the overall composition, more preferably from about 0.5 mol to about 3 mol per liter of the overall composition, and most preferably from about 1 mol to about 2 mol per liter of the overall composition.

The liquid coating composition preferably further comprises a solvent such as water, preferably deionized water. In a most preferred embodiment of the invention, the liquid coating composition comprises an aqueous mixture of cadmium sulfate, thiourea, and ammonium hydroxide. The liquid coating composition may also optionally comprise one or more additives which nonexclusively include surface modification agents such as surfactants, pH modification agents, and the like, which are well known to those skilled in the art.

The liquid coating composition preferably has a pH of from about 9 to about 14, more preferably from about 10 to about 13 and most preferably from about 11 to about 12. The composition can be made up to 30 minutes prior to application before noticeable onset of homogeneous reaction. Preferably, the composition is made immediately prior to application.

Once formed, the liquid coating composition is applied onto a surface of a heated substrate. Prior to deposition, the substrate surface is heated to a temperature which preferably ranges from about 50° C. to about 100° C., more preferably from about 60° C. to about 80° C., and most preferably from about 75° C. to about 85° C. The substrate may be heated using any suitable means known in the art such as a heat plate, lamp, latent heat from prior processing steps, or the like. It is most preferable that liquid coating composition is maintained at a lower temperature than the substrate surface prior to deposition. This is to prevent the occurrence of homogeneous reactions in the bath, thus reducing particulate formation in the liquid coating composition. Prior to deposition, keeping the solution at low temperatures, from about 5° C. to about 25° C., ensures a reasonably long shelf life due to reduction of species evaporation and reduction of reaction rate leading to the onset of homogeneous nucleation in the solution. After the liquid is applied, it gains heat by conduction from the substrate surface. Once applied onto the heated substrate, the temperature of the liquid coating composition preferably ranges from about 5° C. to about 80° C., more preferably from about 40° C. to about 70° C., and most preferably from about 50° C. to about 60° C. The chemical reaction that occurs on the substrate is:

$$Cd(NH_3)_4{}^{++} + (NH_2)_2CS + 2OH^- \leftrightarrow CdS + 4NH_3 + H_2CN_2 + 2H_2O$$

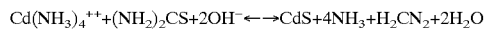

with free energy of reactions of $\Delta G_{rxn}(25°\ C.) = -20.7$ kcal/mol and $\Delta G_{rxn}(100°\ C.) = -24.4$ kcal/mol.

The substrate preferably comprises any suitable material known in the art which is suitable as a semiconductor substrate or solar cell substrate. Preferred substrate materials nonexclusively include plastic, glass, ceramic, metal, amorphous semiconductor materials, crystalline semiconductor materials, polycrystalline semiconductor materials and the like, and combinations thereof. In one preferred embodiment, the substrate comprises glass. At least one surface of the substrate preferably comprises a layer of a conductive material, such as a metal or a transparent conductive oxide (TCO). Suitable metals nonexclusively include molybdenum, platinum, nickel, chromium, gold, titanium, vanadium, and combinations and alloys thereof. Suitable transparent conductive oxides nonexclusively include tin oxide, indium oxide, zinc oxide, gallium oxide, cadmium stannate, zinc stannate and combinations thereof. The conductive material layer may be applied to the surface of the substrate by any suitable method known in the art such as evaporating, spraying, spin-depositing, sputtering, chemical vapor depositing, and the like. The conductive material layer may optionally comprise a conductive grid. TCO-coated substrates are well known in the art, and are commercially available from Libbey-Owens Ford, of Toledo, Ohio, or TFD of Los Angeles, Calif. The surface of the substrate may also optionally comprise a layer of a semiconductor material such as a Group I–III–VI$_2$, Group II–VI, Group II–V, Group III–V, or Group IV semiconductor material, and the like.

Application of the liquid coating composition may be performed using any suitable deposition method known to those skilled in the art, such as flowing or sparging from pipettes, flowing or sparging from rollers, spraying, spin-depositing and the like. The surface tension between the liquid coating composition and the heated substrate determines the maximum solution volume for adhering the composition to a given substrate material without the use of a containment barrier along the edges. The surface tension can be modified by the addition of a wetting agent to the solution, such as glycerine. Depending on such surface tension, application of the liquid onto the substrate may optionally be conducted upside down. Addition of surface modification agents as described above may change the limiting volume that adheres to the substrate. Furthermore, a containment frame may be used to increase the total volume of applied solution.

Once the liquid coating composition is applied, heat flows from the substrate to the liquid, causing a reaction between the Group IIB ionic species and the Group VIA ionic species. This results in the formation of a solid reaction product film on the substrate surface. The reaction is allowed to proceed for a predetermined time, preferably ranging from about 1 to about 10 minutes. Any excess liquid coating composition which remains on the substrate may be discarded. It is important to not let the sample dry during reaction, in order to prevent non-uniformities and inclusions of secondary products in and on the film. The resulting film may optionally be rinsed with water and dried using any suitable method known in the art such as by baking or drying under a forced argon stream.

The solid reaction product film comprises a material which comprises a reduced form of the Group IIB ionic species and the Group VIA ionic species of the liquid coating composition. The film preferably comprises at least one material selected from the group consisting of cadmium sulfide, zinc sulfide, mercury sulfide, cadmium telluride, zinc telluride, mercury telluride, cadmium selenide, zinc selenide, mercury selenide, cadmium oxide, zinc oxide, and mercury oxide and combinations and alloys thereof. Most preferably, the film comprises cadmium sulfide.

The film optionally further comprises at least one additional species to provide alloy compounds or to provide a dopant for the semiconductor. Suitable additional species for alloy formation nonexclusively include magnesium, calcium, strontium, barium, and combinations thereof. Suitable additional species for doping nonexclusively include Group III and Group V components such as boron, aluminum, indium, gallium, thallium, nitrogen, phosphorous, arsenic, antimony, bismuth, and combinations thereof. The additional species may be incorporated into the film by the inclusion of an ionic species component of the additional species in the liquid coating composition at a concentration of from about 0.1 millimol to about 10 millimol per liter of the overall composition, more preferably from about 0.5 millimol to about 5 millimol per liter of the overall composition, and most preferably from about 1 millimol to about 2 millimol per liter of the overall composition. In the case of dopant species, lower ionic species concentrations are preferred and can be controlled in the present invention by ionic concentration in the solution or by the addition of complexing agents such as tetraethylamine (TEA) or ethylene diamine tetra-acetic acid (EDTA).

The film's thickness preferably ranges from about 100 Å to about 1000 Å, more preferably from about 200 Å to about 800 Å, and most preferably from about 300 Å to about 500 Å. The thickness of the film is dependent on the concentration of the Group IIB species in the solution, since the formation of the film preferably stops when the Group IIB species is completely utilized. Furthermore, a containment frame, Group IIB and complexing agent species replenishment, or multiple applications may be used to increase the thickness. In a preferred embodiment of the present invention, multiple applications of the inventive process, which enable the formation of additional film layers on the solid reaction product film, yield an overall film thickness increase which is linearly proportional to the number of coatings. The film's thickness may be measured using any suitable method known in the art such as optical absorption and step profilometry.

The film's grain size, morphology, and atomic smoothness are influenced by the deposition conditions. In a preferred embodiment of the invention, a single coating yielded CdS films of about 400 Å thick, with dense, conformal film coverage, and low area densities of adherent particulates, less than about $1 \times 10^5$ particulates per square centimeter of area. By comparison, a film deposited by the conventional art with the same thickness yielded greater than $1 \times 10^8$ particulates per square centimeter, consisting of homogeneously nucleated CdS and reaction by-products. The film's grain size, morphology, and atomic smoothness may be determined using any suitable method known in the art, such as by atomic force microscopy (AFM) or scanning electron microscopy (SEM)

The films formed according to the present invention exhibit low particulate density and high utilization of the Group IIB species. Such films are preferably used in forming window layers for thin film solar cells, but may have other useful applications in the art.

The following non-limiting examples serve to illustrate the invention. It will be appreciated that variations in proportions and alternatives in elements of the components of the invention will be apparent to those skilled in the art and are within the scope of the present invention.

EXAMPLE 1

CdS Thin-Film Formation

Stock aqueous solutions of 0.015 M cadmium sulfate, $CdSO_4$, 1.5 M thiourea, $CS(NH_2)_2$, and 14.28 M ammonium hydroxide, $NH_4OH$, were placed in titrating burets for volumetric dispensation.

The following quantities of the solutions were dispensed into a mixing beaker with deionized water to form the working solution, at a temperature of 25° C. The volumetric proportions were:

2.2 ml $CdSO_4$ 2.2 ml $CS(NH_2)_2$ 2.8 ml $NH_4OH$ 15 ml $H_2O$

Several indium tin oxide coated glass substrates were placed under a glass cover on a heated plate at temperatures of 55° C., 65° C., 75° C., 85° C., and 95° C., and allowed to heat for 10 minutes prior to application of the solution. The glass covers were removed, 0.7 ml per square inch of working solution was applied to the surface of each substrate, and timing clocks were started. At the end of the prescribed reaction times, ranging from 2–6 minutes, residual solution was transferred from each sample surface to a waste beaker. The coated substrates were rinsed in flowing de-ionized water and dried under a forced argon gas stream. To avoid incorporation of non-CdS phases, samples were rinsed immediately after the CdS reaction appeared to be completed. The time for this completion is referred to hereafter as the "reaction time". This process resulted in ultra-thin, 100–500 Å, CdS films with high utilization of Cd species.

Reaction Time versus Reaction Temperature:

The time to complete the reaction varied with temperature for fixed total quantity of solution is shown in Table 1.

TABLE 1

Reaction time.

| Reaction Temp. (° C.) | Saturation Time (min) |
|---|---|
| 55 | 6 |
| 65 | 5 |
| 75 | 3 |
| 85 | 2 |
| 95 | 2 |

Thickness versus Cadmium Concentration and Reaction Temperature:

Thickness was determined by optical absorption and step profilometry. Using the reaction times shown in Table 1, films were deposited at different temperatures and Cd species concentration as shown in Table 2, thickness increased with temperature for fixed Cd concentration. At fixed temperature, such as 75° C., thickness increased with total Cd concentration until about 3 mMol, at which concentration, the obtained film thickness saturated. This was due to loss of ammonia species and stalling of the reaction as the applied solution heated. The maximum film thickness achieved for a single coating was about 500 Å, obtained at about 3 mMol and about 85° C. In a separate experiment performed on similar substrates at about 80° C., it was found that multiple coatings resulted in a thickness increase which is linearly proportional to the number of coatings.

TABLE 2

Thickness (Å)

| Temp (° C.) | [Cd] (mMol) | | | | |
|---|---|---|---|---|---|
| | 1.5 | 2.0 | 3.0 | 4.0 | 5.0 |
| 55 | 70 | | | | |
| 65 | 160 | | | 380 | |
| 75 | 225 | 305 | 420 | 395 | 430 |
| 85 | 230 | | 500 | 415 | |
| 95 | 235 | | | 305 | |

Cd Utilization versus Concentration and Reaction Temperature: Utilization of Cd species was calculated by mass balance from applied solution to thickness of deposited CdS film and is shown in Table 3. Cd species utilization increased with reaction temperature and was >80% for cadmium ion concentrations from about 1.5 to about 3 mMol. Thus, high utilization can be obtained for film thicknesses from about 200 to about 500 Å.

TABLE 3

Utilization of Cd species (%)

| Temp (° C.) | [Cd] (mMol) | | | | |
|---|---|---|---|---|---|
| | 1.5 | 2.0 | 3.0 | 4.0 | 5.0 |
| 55 | 28 | | | | |
| 65 | 65 | | | 56 | |
| 75 | 90 | 85 | 84 | 58 | 51 |
| 85 | 92 | | 100 | 60 | |
| 95 | 94 | | | 45 | |

EXAMPLE 2

CdTe Solar Cell Formation

A device was fabricated in superstrate configuration using a single chemical surface deposited (CSD) CdS coating applied to a glass/TCO/HRT (High Resistance Transparent layer) structure consisting of Corning 7059 glass/indium tin oxide/indium oxide. The CdS film was deposited by CSD for 3 min at 80° C. using the solution described in Example 1. A 4 micron thick CdTe absorber layer was deposited by evaporation at 340° C. The CdTe/CdS/HRT/TCO/glass structure was annealed at 600° C. in argon for 10 minutes and then treated in $CdCl_2:O_2:Ar$ vapor at 400° C. for 20 minutes. Ohmic contact was formed by depositing $Cu_2Te$ followed by application of a conductive graphite ink.

Figure 3:
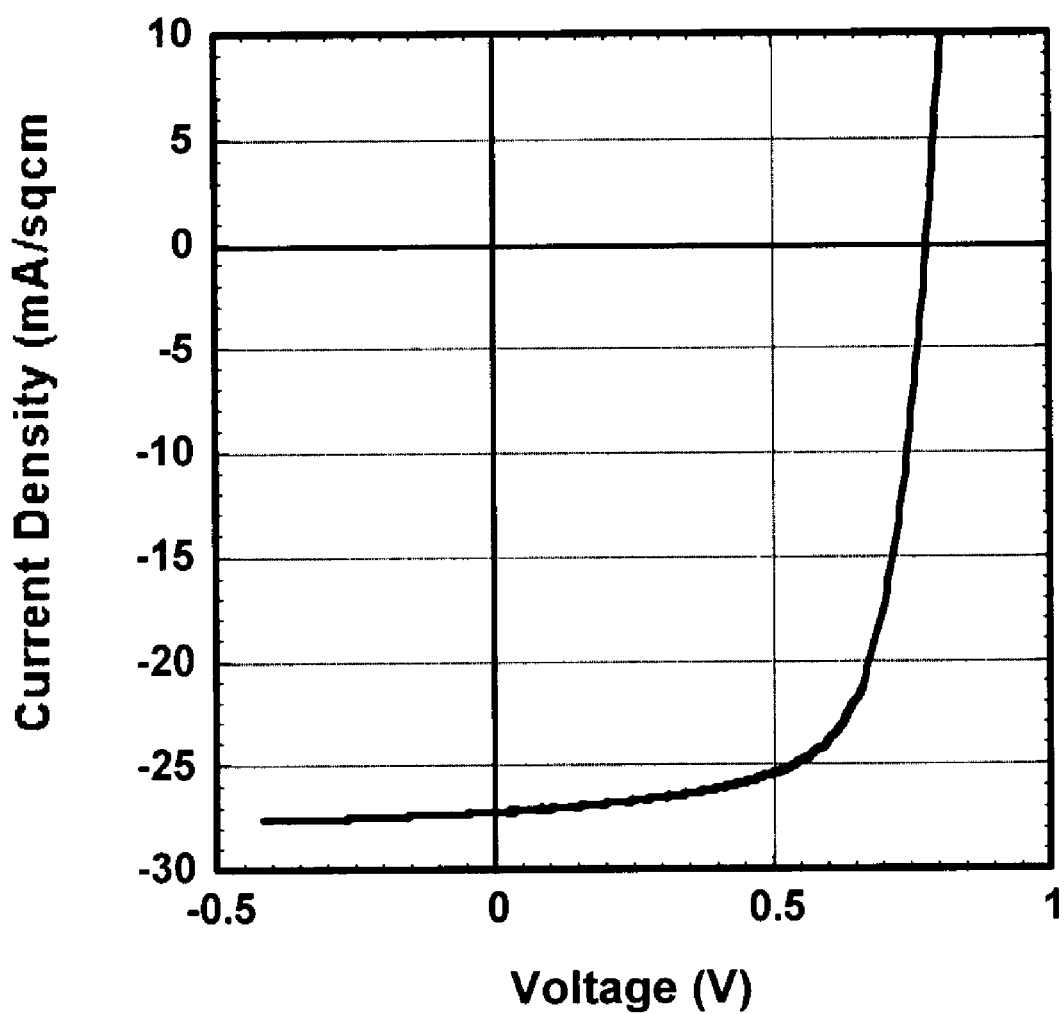
FIG. 3 shows a current-voltage (J-V) curve of the device formed according to Example 2.

Current-voltage (J-V) parameters are summarized in Table 4. The term "Voc" represents open circuit voltage; "Jsc" represents short circuit current; "FF" represents fill factor; and "Eff" represents efficiency (at AM 1.5 spectrum, 28° C.). FIG. 3 shows the J-V curve of the device.

TABLE 4

CdTe/CdS device J-V results.

| Device | Voc (mV) | Jsc (mA/cm$^2$) | FF (%) | Eff (%) |
|---|---|---|---|---|
| CdTe/CdS | 790 | 26.0 | 68 | 13.8 |

The efficiency of this cell is among the highest obtained for a CdTe/CdS device made using evaporated CdTe. This data shows that such chemical surface deposited (CSD) CdS films yield high quality devices that are amenable to large area manufacturing of CdTe/CdS photovoltaic devices.

EXAMPLE 3

$CuInGaSe_2$ ("CIGS") Solar Cell Formation

Devices were fabricated in substrate configuration using chemical surface deposited CdS on $Cu(InGa)Se_2$ films from a single deposition. The $Cu(InGa)Se_2$ was deposited by elemental evaporation at 550° C. and was 2 microns thick. The CdS coating was applied to three structures consisting of soda lime glass/molybdenum/$Cu(InGa)Se_2$.

1. Sample 1 was the control sample with CdS deposited by the baseline CdS chemical bath process.
2. Sample 2 had the CdS deposited by chemical surface deposition using the following volumetric proportions: 2.8 ml of 0.015 Mol $CdSO_4$+2.2 ml of 1.5 M $CS(NH_2)_2$+2.2 ml of 14 M $NH_4OH$+15 ml of $H_2O$. The sample was pre-heated for 10 minutes to 80° C.
3. Sample 3 had the CdS deposited by chemical surface deposition with two coats, 3 minutes each of the same solution as in Sample 2.

Solar cell devices were completed with the sputter deposition of an Al-doped ZnO layer which was 0.5 μm thick and had sheet resistance of 20 Ω/square, followed by a Ni/al collector grid. Individual cells with total area 0.47 cm$^2$ were delineated by mechanical scribing.

Current-voltage (J-V) parameters are summarized in Table 5. Sample 3 had comparable Voc and FF to the control sample but lower Jsc. With efficiency greater than about 13% these results demonstrate that the chemical surface deposition of CdS can be used on $Cu(InGa)Se_2$.

TABLE 5

Cu(InGa)Se2/CdS device results

| Sample # | CdS Deposition | Voc (Volts) | Jsc (mA/cm$^2$) | FF (%) | Eff (%) |
|---|---|---|---|---|---|
| 1 | control:chemical bath deposition | 0.63 | 32.3 | 75.6 | 15.4 |
| 2 | single layer chemical surface deposition | 0.63 | 29.6 | 64.8 | 12.2 |
| 3 | double layer chemical surface deposition | 0.62 | 28.4 | 75.1 | 13.2 |

The examples show that the process taught by the present invention results in the formation of high quality, ultra-thin films with high Group IIB utilization that are amenable to large area manufacturing of photovoltaic solar cell devices.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for forming a film on a substrate which comprises:
    a) forming a liquid coating composition which comprises at least one Group IIB ionic species, at least one Group VIA ionic species, and a complexing agent capable of causing the Group IIB ionic species and the Group VIA ionic species to combine;
    b) applying the liquid coating composition onto a heated substrate surface, which substrate surface is at a temperature higher than the temperature of the liquid coating composition; and
    c) causing the Group IIB ionic species and the Group VIA ionic species to react on the heated substrate surface under conditions sufficient to form a solid reaction product film comprising a reduced form of the Group IIB ionic species and the Group VIA ionic species on the substrate surface.

2. The process of claim 1 further comprising the subsequent step of removing any excess liquid coating composition from the substrate.

3. The process of claim 1 further comprising the subsequent step of rinsing the film with water.

4. The process of claim 3 further comprising the subsequent step of drying the film.

5. The process of claim 1 wherein the concentration of the Group IIB ionic species component of the liquid coating composition ranges from about 0.1 millimol per liter to about 10 millimol per liter.

6. The process of claim 1 wherein the concentration of the Group VIA ionic species component of the liquid coating composition ranges from about 0.05 mol per liter to about 5 mol per liter.

7. The process of claim 1 wherein the concentration of the complexing agent of the liquid coating composition ranges from about 0.1 mol per liter to about 5 mol per liter.

8. The process of claim 1 wherein the liquid coating composition comprises water.

9. The process of claim 1 wherein the complexing agent is capable of causing the Group IIB ionic species and the Group VIA ionic species to combine upon the application of sufficient heat.

10. The process of claim 1 wherein the complexing agent comprises a nitrogen-hydride compound.

11. The process of claim 1 wherein the complexing agent comprises ammonium hydroxide.

12. The process of claim 1 wherein the Group IIB ionic species comprises cadmium, mercury, zinc, or combinations thereof.

13. The process of claim 1 wherein the Group IIB ionic species is obtained from an aqueous solution of cadmium, mercury or zinc sulfate, acetate, bromide, fluoride, chloride, iodide, hydroxide, nitrate, oxalate, citrate, phosphate, tungstate, hydrates or combinations thereof.

14. The process of claim 1 wherein the Group VIA ionic species comprises oxygen, sulfur, selenium, tellurium, polonium, or combinations thereof.

15. The process of claim 1 wherein the Group VIA ionic species is obtained from an aqueous solution of oxides, halides, sulfates, nitrates, or ureates of the Group VIA species or combinations thereof.

16. The process of claim 1 wherein the solid reaction product film further comprises at least one additional metal species.

17. The process of claim 1 wherein the solid reaction product film further comprises at least one additional species selected from the group consisting of magnesium, calcium, strontium, barium, aluminum, indium, gallium, thallium, nitrogen, phosphorous, arsenic, antimony, bismuth and combinations thereof.

18. The process of claim 1 wherein the liquid coating composition has a pH of from about 9 to about 14.

19. The process of claim 1 wherein the substrate comprises plastic, glass, ceramic, metal, amorphous semiconductor materials, crystalline semiconductor materials, polycrystalline semiconductor materials, or combinations thereof.

20. The process of claim 1 wherein a surface of the substrate comprises a layer of a transparent conductive oxide.

21. The process of claim 1 wherein a surface of the substrate comprises a layer of a transparent conductive oxide selected from the group consisting of tin oxide, indium oxide, zinc oxide, gallium oxide, cadmium stannate, zinc stannate, and combinations thereof.

22. The process of claim 1 wherein a surface of the substrate comprises a layer of a semiconductor material.

23. The process of claim 1 wherein a surface of the substrate comprises a layer of a semiconductor material selected from the group consisting of Group I–III–VI$_2$, Group II–VI, Group II–V, Group III–V, and Group IV semiconductor materials.

24. The process of claim 1 wherein the substrate surface is heated to a temperature ranging from about 50° C. to about 100° C. and wherein the liquid coating composition is applied at a temperature ranging from about 5° C. to about 80° C.

25. The process of claim 1 wherein the film has a thickness of from about 100 Å to about 1000 Å.

26. The process of claim 1 wherein the film comprises at least one material selected from the group consisting of cadmium sulfide, zinc sulfide, mercury sulfide, cadmium telluride, zinc telluride, mercury telluride, cadmium selenide, zinc selenide, mercury selenide, cadmium oxide, zinc oxide, mercury oxide, and combinations and alloys thereof.

27. The process of claim 1 wherein the film comprises cadmium sulfide.

28. The process of claim 1 wherein the liquid coating composition comprises an aqueous mixture of cadmium sulfate, thiourea, and ammonium hydroxide.

29. The process of claim 1 which further comprises repeating steps (a)–(c) to form least one additional film layer on the solid reaction product film.

30. A process for forming a solar cell which comprises:
   a) forming a liquid coating composition which comprises at least one Group IIB ionic species, at least one Group VIA ionic species, and a complexing agent capable of causing the Group IIB ionic species and the Group VIA ionic species to combine;
   b) applying the liquid coating composition onto a heated substrate surface, which substrate surface is at a temperature higher than the temperature of the liquid coating composition;
   c) causing the Group IIB ionic species and the Group VIA ionic species to react on the heated substrate surface under conditions sufficient to form a solid reaction product film comprising a reduced form of the Group IIB ionic species and the Group VIA ionic species on the substrate surface;
   d) removing any excess liquid coating composition from the substrate;
   e) rinsing the film with water; and
   f) drying the film.

31. The process of claim 30 which further comprises repeating steps (a)–(f) to form least one additional film layer on the solid reaction product film.

32. A solar cell formed by the process of claim 30.

* * * * *